US009166731B2

(12) United States Patent
Chang et al.

(10) Patent No.: US 9,166,731 B2
(45) Date of Patent: Oct. 20, 2015

(54) TRANSFORMER WITH INTEGRATED NOTCH FILTER

(71) Applicant: QUALCOMM Incorporated, San Diego, CA (US)

(72) Inventors: Li-Chung Chang, Irvine, CA (US); Ehab A Abdel Ghany, San Diego, CA (US); Ahmed A Youssef, San Diego, CA (US)

(73) Assignee: Qualcomm Incorporated, San Diego, AS (US)

( * ) Notice: Subject to any disclaimer, the term of this patent is extended or adjusted under 35 U.S.C. 154(b) by 191 days.

(21) Appl. No.: 13/901,335

(22) Filed: May 23, 2013

(65) Prior Publication Data

US 2014/0347142 A1 Nov. 27, 2014

(51) Int. Cl.
| H03H 7/42 | (2006.01) |
| H04K 3/00 | (2006.01) |
| H03H 7/01 | (2006.01) |
| H04B 1/10 | (2006.01) |
| H03H 7/07 | (2006.01) |
| H03H 7/00 | (2006.01) |

(52) U.S. Cl.
CPC ............. *H04K 3/228* (2013.01); *H03H 7/0115* (2013.01); *H03H 7/0184* (2013.01); *H03H 7/07* (2013.01); *H03H 7/1775* (2013.01); *H04B 1/1036* (2013.01); *H03H 2007/013* (2013.01); *H03H 2210/01* (2013.01)

(58) Field of Classification Search
CPC .................................... H03H 5/00; H01P 5/00
USPC .................................................... 333/25, 26, 4
See application file for complete search history.

(56) References Cited

U.S. PATENT DOCUMENTS

| 6,704,557 | B1 | 3/2004 | Krishnamurthy et al. |
| 6,850,747 | B1 | 2/2005 | Imbornone et al. |
| 7,683,733 | B2 * | 3/2010 | Li et al. ........................... 333/25 |
| 7,961,063 | B2 * | 6/2011 | Liu et al. ......................... 333/26 |
| 8,018,297 | B2 * | 9/2011 | Aoki ............................... 333/25 |
| 8,301,101 | B2 | 10/2012 | Mirzaei et al. |
| 2006/0273870 | A1 * | 12/2006 | Yeung et al. .................. 333/204 |
| 2008/0139149 | A1 * | 6/2008 | Mu et al. ..................... 455/200.1 |
| 2010/0136942 | A1 | 6/2010 | Lee et al. |
| 2011/0003569 | A1 | 1/2011 | Mirzaei et al. |
| 2012/0243447 | A1 | 9/2012 | Weissman et al. |
| 2013/0016798 | A1 | 1/2013 | Velazquez et al. |

OTHER PUBLICATIONS

Anatol I. Zverev, Handbook of Filter Synthesis, 1967, John Wiley & Sons, ISBN 0 471 98680 1, 16 pages.*
International Search Report and Written Opinion—PCT/US2014/038684—ISA/EPO—Sep. 26, 2014.

(Continued)

*Primary Examiner* — Dean Takaoka
(74) *Attorney, Agent, or Firm* — Smith Risley Tempel Santos LLC

(57) ABSTRACT

Techniques for providing low-cost and effective jammer rejection for a radio receiver. In an aspect, a notch filter is provided between a transformer and a differential mixer in the receiver. The notch frequency of the notch filter may be selected to correspond to an expected jammer frequency to effectively attenuate the jammer signal prior to down-conversion mixing by the mixer. The notch filter may be implemented using various techniques, e.g., an L-C combination having adjustable capacitance, and/or elliptic or Chebyshev filters.

18 Claims, 11 Drawing Sheets

(56) References Cited

OTHER PUBLICATIONS

Ragonese E., et al., "A 5-GHz highly integrated receiver front-end", Analog Integrated Circuits and Signal Processing, Kluwer Academic Publishers,BO, vol. 53, No. 1, Aug. 3, 2007, pp. 3-7, XP019547930, ISSN:1573-1979, DOI: 10.1007/S10470-007-9071-7.

Vallese A., et al., "Analysis and Design of an Integrated Notch Filter for the Rejection of Interference in UWB Systems", IEEE Journal of Solid-State Circuits, IEEE Service Center, Piscataway, NJ, USA, vol. 44, No. 2, Feb. 1, 2009), pp. 331-343, XP011243148, ISSN: 0018-9200, DOI: 10.1109/ JSSC.2008.2010984.

Zhang G., et al., "A Superconducting Microstrip Bandstop Filter for an l-band Radio Telescope Receiver", 2005 European Microwave Conference CNIT La Defense, Paris, France Oct. 4-6, 2005, Piscataway, NJ, USA,IEEE,vol. 1, Oct. 4, 2005, pp. 697-700, XP010903377, DOI: 10.1109/ EUMC.2005.1608952, ISBN: 978-2-9600551-2-2, Abstract, Section II. Bandstop Filter Design.

\* cited by examiner

TRANSFORMER WITH INTEGRATED NOTCH FILTER

BACKGROUND

1. Field

The disclosure relates to communications circuitry, and, in particular, to a transformer with integrated notch filter for jammer rejection in radio receivers.

2. Background

Modern wireless devices are commonly designed to concurrently support multiple radio communications links. For example, a single smart phone device may be required to simultaneously connect to a wide-area network (WAN), a wireless local-area network (WLAN), and/or other radio-frequency (RF) communication links such as Bluetooth, etc. The presence of such multiple RF transmissions originating from the device itself, as well as from other wireless devices in its vicinity, gives rise to potentially strong jammers that can interfere with accurate reception of a desired signal by the device. Accordingly, a radio receiver must be designed to accommodate such jammers, e.g., significantly attenuate or eliminate them, in the receive signal path.

Prior art techniques for jammer rejection include providing one or more passive filters in a radio receive signal path. Such an approach undesirably increases insertion loss and correspondingly degrades the sensitivity of the receiver. Another prior art technique includes designing certain frequency-selective properties into a feedback network of a low-noise amplifier (LNA) of the radio receiver. However, such an approach may cause instability in the receiver, and also negatively impact the receiver performance.

Accordingly, it would be desirable to provide low-cost and effective techniques to provide jammer rejection for a radio receiver that do not suffer from the drawbacks of the prior art.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
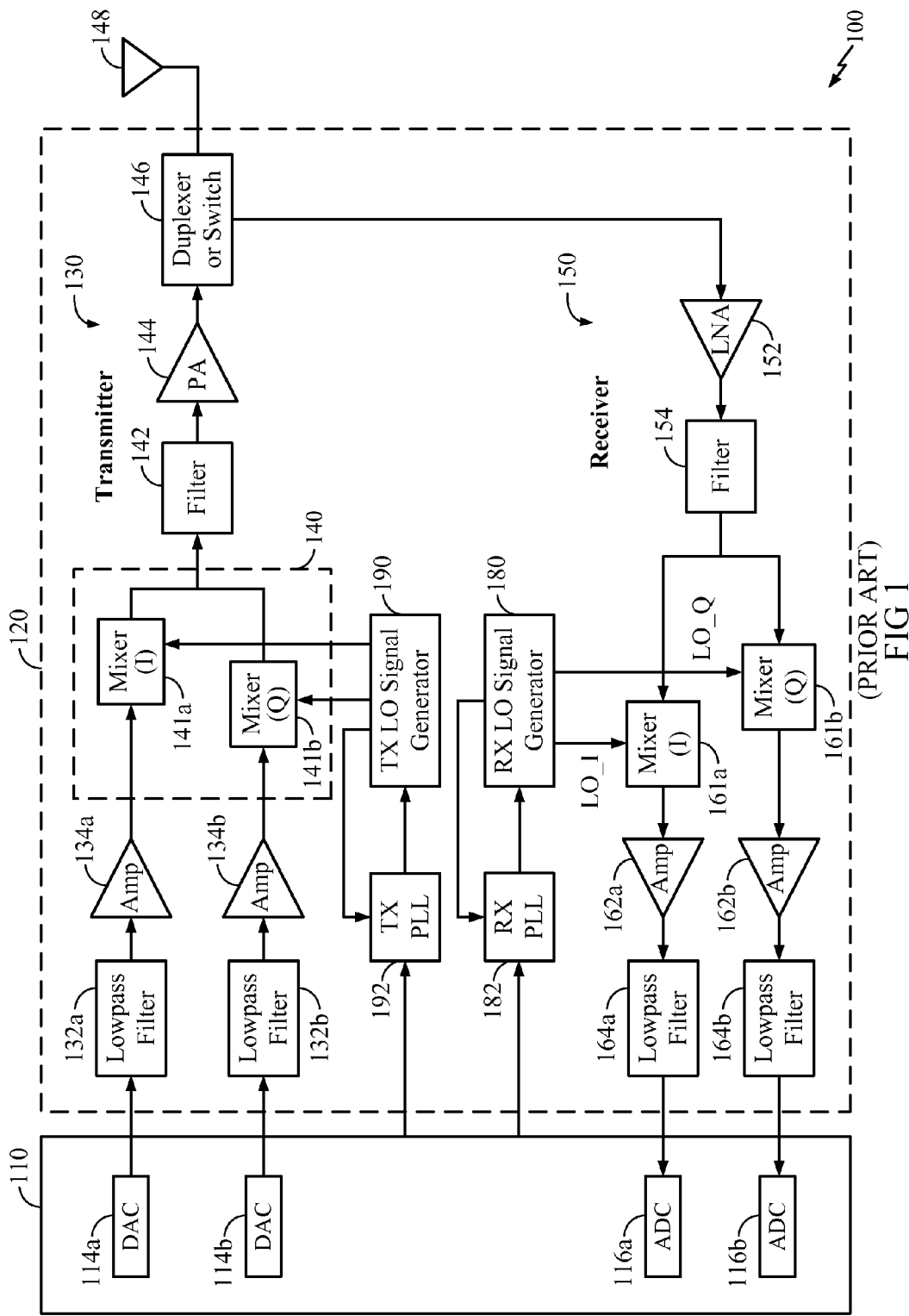
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by lowpass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

To reduce the pin count of the chip, the input to the receiver 150 may typically be single-ended. The LNA 152 may thus accept a single-ended input voltage, and also output a single-ended output voltage. On the other hand, for better RF/LO isolation, it is desirable to use a double-balanced topology for the subsequent mixer stage by providing a differential input for the mixer. Accordingly, in certain implementations, as illustrated in the sample prior art radio architecture 200 of FIG. 2, a balun 153 may be provided between the single-ended output of the LNA 152 and the differential input of mixer 161 (or multiple mixers in alternative implementations of the receiver). The balun 153 may convert a single-ended signal to a differential signal, and may include, e.g., a transformer that mutually couples a signal from a primary winding 153a to a secondary winding 153b.

Figure 2:
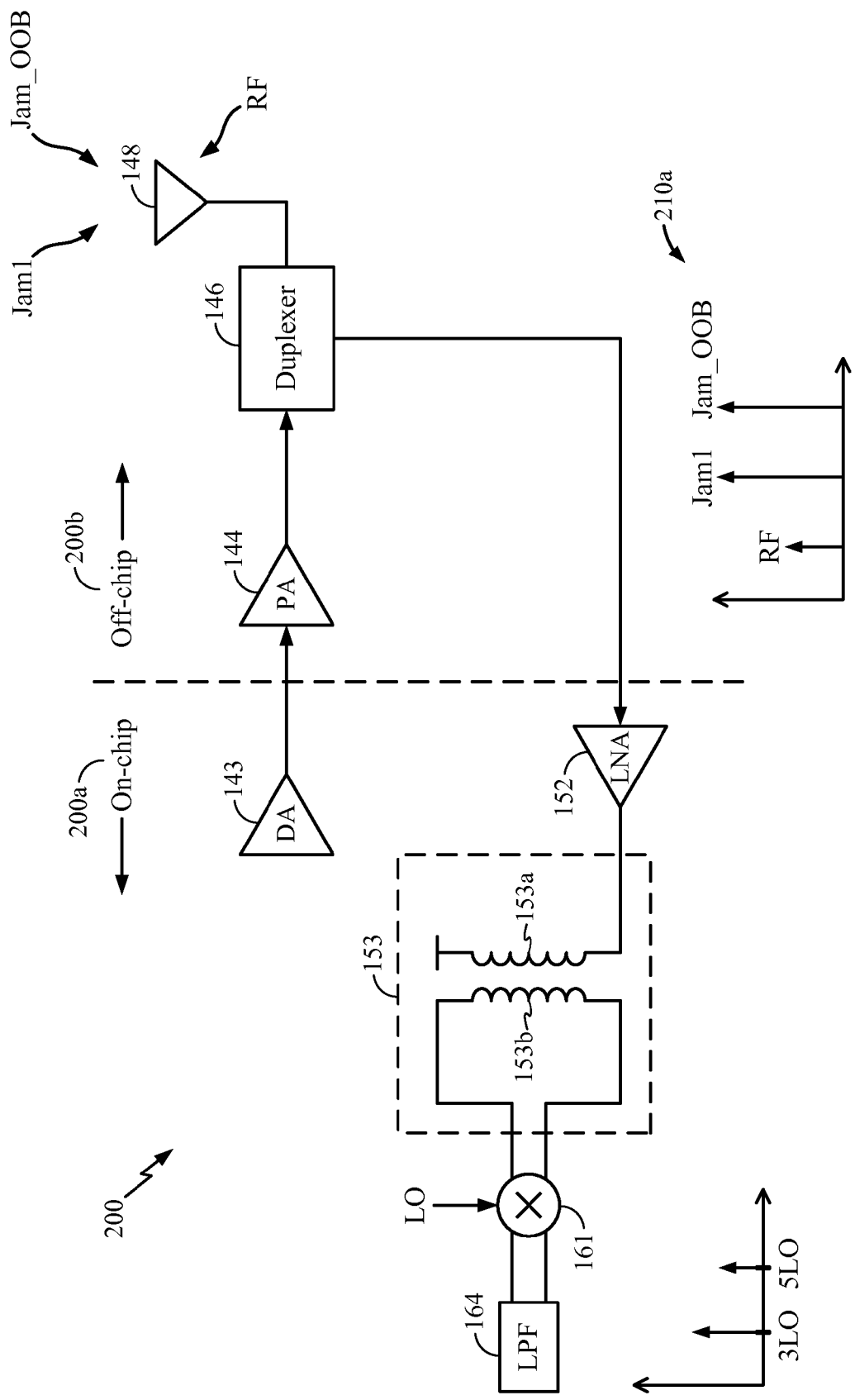
FIG. 2 illustrates a sample prior art radio architecture wherein a balun is provided between the LNA and mixers.

Note while FIG. 2 illustrates an exemplary partitioning of radio functions between on-chip 200a and off-chip 200b modules, it is not meant to limit the scope of the present disclosure to any particular partitioning shown. Further note that, in FIG. 2, an on-chip driver amplifier (DA) 143 is illustratively shown as being provided to drive an off-chip power amplifier (PA) 144 on the transmitter side of the device.

A feature of modern wireless devices is that multiple radios may operate simultaneously in a single device. The multiple transmissions caused by such simultaneous operation of multiple radios may create numerous strong jammer tones within the device. The jammer tones act as interference to the receiver portions of the device, potentially seriously degrading the receiver sensitivity and thus posing a challenge for the receiver design. For example, when wide-area network (WAN) and wireless local area network (WLAN) radios operate together in a single device, the WLAN transmit signal (Tx) may act as an out-of-band (OOB) jammer (also labeled "Jam_OOB" in FIG. 2) to the WAN receive path (Rx). Such a jammer (or multiple jammers, when there are other radios) may undesirably desensitize the WAN receive signal path (i.e., WAN Rx), due to at least the following mechanisms:

1) When other jammers are present along with Jam_OOB at the input to the receiver, the subsequent down-conversion mixing stages may generate intermodulation products that lie at baseband frequencies, which undesirably desensitize the receiver. For example, the presence of a Jam_OOB along with an additional jammer (illustratively labeled in FIG. 2 as "Jam1"), which could correspond to, e.g., the WAN Tx or other harmonics of in-band receiver jammers, may generate an intermodulation product lying within the baseband WAN signal bandwidth, thus desensitizing the in-band WAN Rx signal.

2) Certain non-linear behavior of the receive circuitry, e.g., as quantified by second-order input intercept point (IIP2), may cause the jammer to be translated to baseband, further desensitizing the receiver. For example, the presence of Jam_OOB at the receiver input may generate distortion components at baseband.

3) Various harmonics of the local oscillator (LO) may be present at the LO input to the mixer. Such LO harmonics may be mixed by the mixer with Jam_OOB, which may translate the jammer down to baseband. Since in many implementations, the power of the LO harmonics can be very strong, strong reciprocal mixing products may be generated with even a weak Jam_OOB signal.

In view of the plurality of mechanisms by which one or more jammers may undesirably degrade receiver sensitivity, it would be desirable to significantly attenuate jammer strength, e.g., Jam_OOB and/or Jam1, prior to mixing with the LO in the receive signal path.

Figure 3:
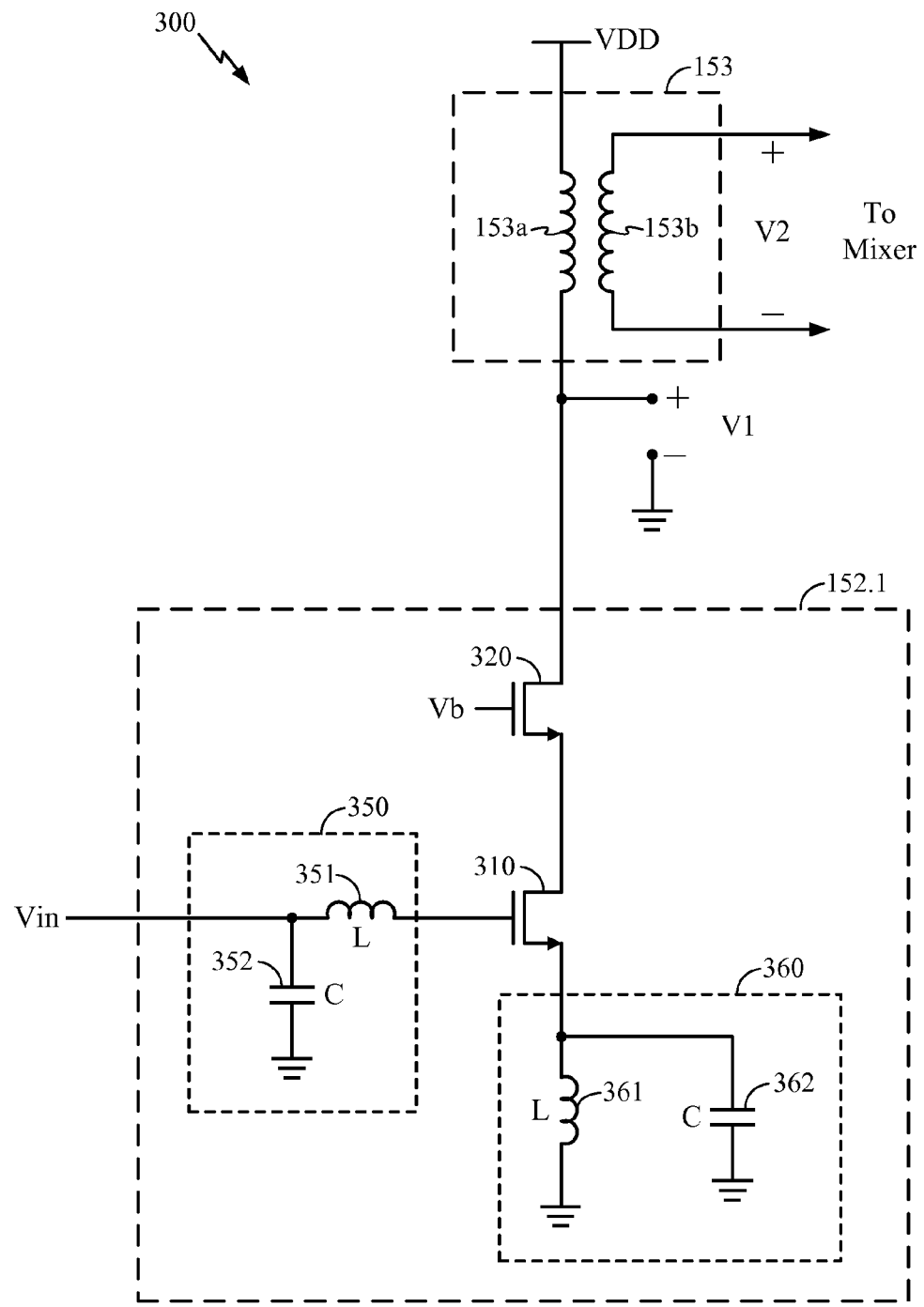
FIG. 3 illustrates a sample receiver portion incorporating various prior art techniques for dealing with jammers.

FIG. 3 illustrates a sample receiver portion 300 incorporating various prior art techniques for dealing with jammers. In FIG. 3, the low-noise amplifier (LNA) 152.1 includes an input transistor 310 coupled to a cascode transistor 320. The drain of the cascode transistor 320 supports the single-ended output voltage V1 of the amplifier 152.1, which is further transformed by transformer 153 into a differential voltage V2. An input voltage Vin to the LNA 152.1, e.g., as derived from an output of the duplexer 146 of FIG. 1, is coupled to the gate of input transistor 310 in series with a matching network or L-C filter configuration 350.

In an implementation, the L-C filter 350 may include an inductor 351 and a capacitor 352, with values appropriately chosen to pass through desired received signal frequencies, while attenuating other frequencies, e.g., jammer frequencies. For example, since an OOB jammer is expected to lie at a relatively high frequency relative to the desired signal frequency, the matching network 350 can be relied on to provide some filtering of the OOB jammer. However, when the OOB jammer is too strong, or when the jammer frequency is low, then to provide sufficient attenuation, more orders of filtering may be required beyond the first-order filtering provided by the matching network 350. This could result in more matching components and increased product cost.

In FIG. 3, the source of input transistor 310 is further coupled to an L-C filter 360, which includes an inductor 361 coupled in parallel with a capacitor 362. Similarly to the L-C filter 350, the inductor 361 and capacitor 362 of the L-C filter 360 may also be appropriately chosen to enhance amplifier gain at the desired received signal frequencies, and to attenuate amplifier gain at other frequencies, e.g., jammer frequencies. In particular, the value of the capacitance C 362 may be tuned so that the resonant frequency of the LC combination 360 corresponds to the OOB jammer frequency, causing the source degeneration to have a high impedance at the jammer frequency, thus rejecting the jammer tone. However, it will be appreciated that providing the filter 360 at the source of input transistor 310 may undesirably cause instability of the LNA 152.1, due to the feedback effects generated thereby.

To reduce the risk of instability, the capacitor 362 may be designed as a low Q (quality factor) device; however, this degrades the jammer rejection performance of the technique. Moreover, in some cases, the OOB jammer may be so strong in power that, despite implementing both the aforementioned approaches (e.g., providing both L-C networks 350 and 360), the receiver 150 may still experience significant desensitization.

Accordingly, there is a need for providing low-cost and effective techniques for attenuating jammers prior to the receiver down-conversion mixing.

Figure 4:
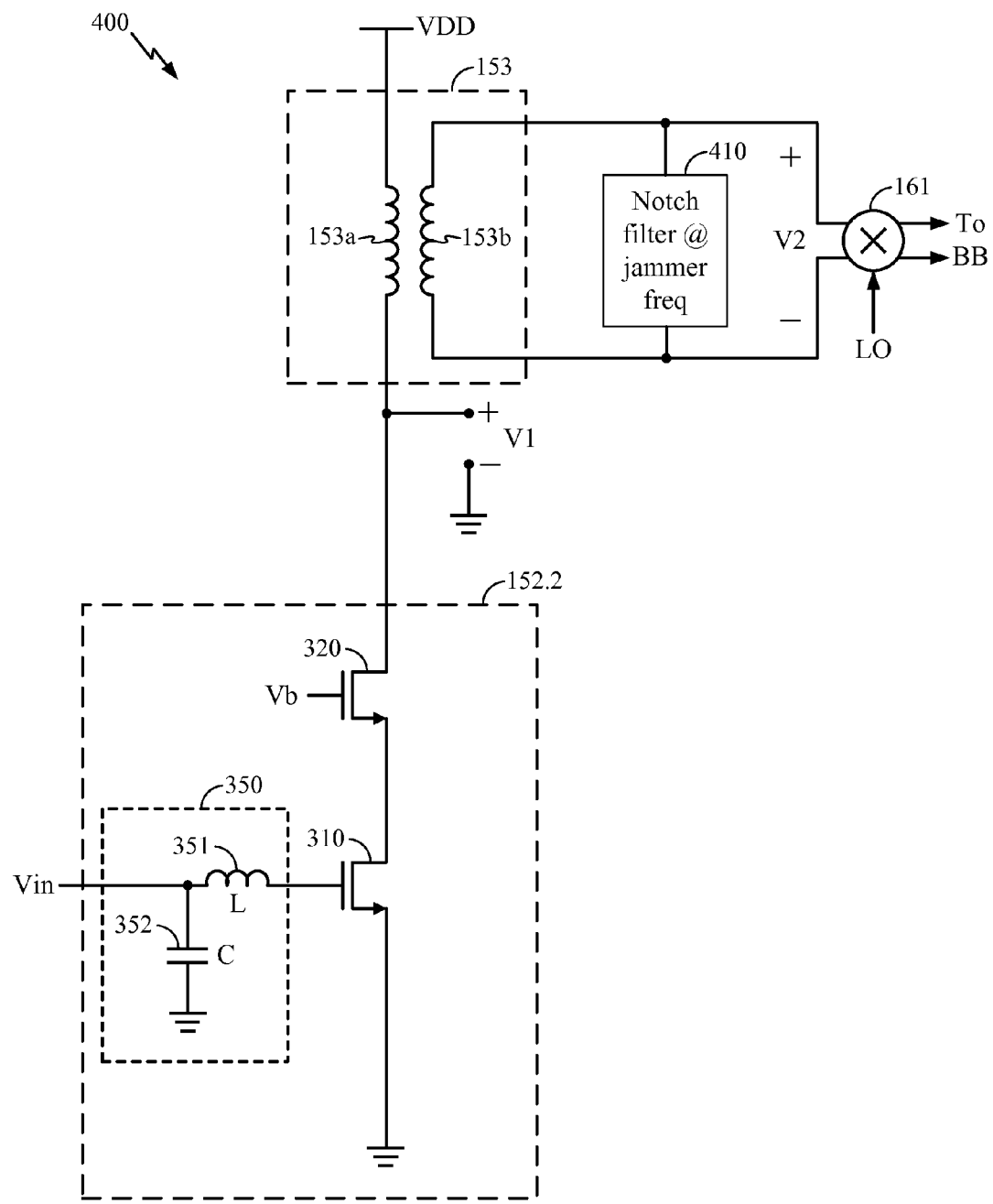
FIGS. 4, 4A, and 4B illustrate exemplary embodiments of jammer rejection techniques according to the present disclosure.
Figure 5:
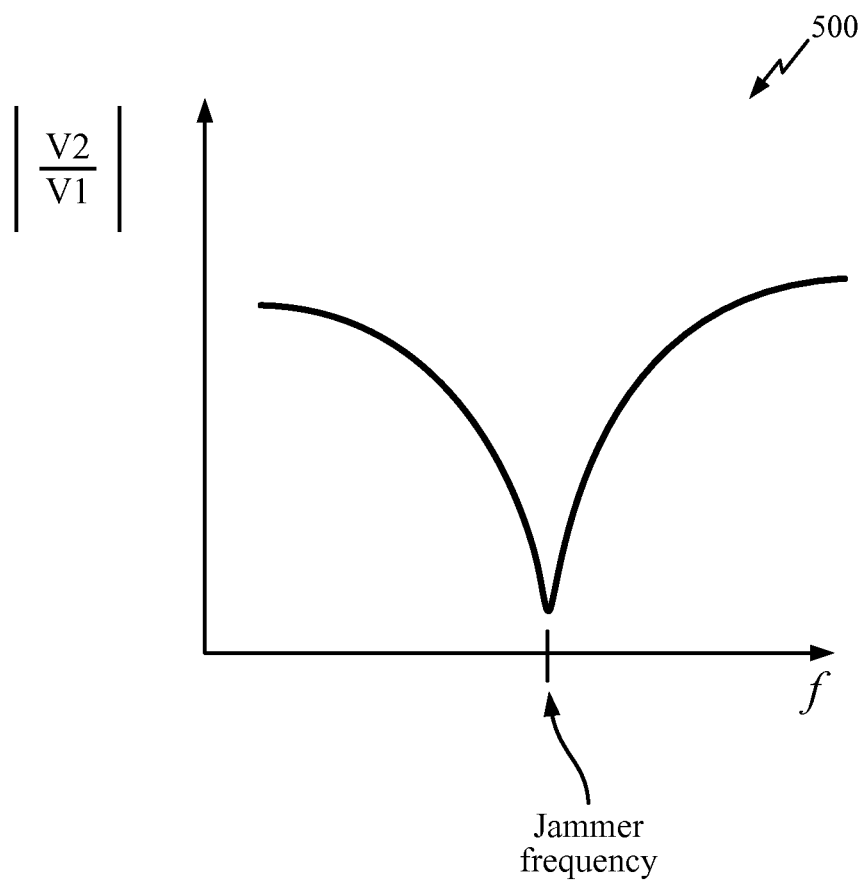
FIG. 5 illustrates an exemplary frequency response of the signals described herein.

FIG. 4 illustrates an exemplary embodiment of jammer rejection techniques according to the present disclosure. In FIG. 4, a notch filter 410 is provided after the transformer (XFMR) 153 and before the mixer 161. The notch filter 410 is coupled between the nodes of the differential portion 153b of the transformer 153. FIG. 5 illustrates an exemplary frequency response of the signals described herein. Note FIG. 5 is provided for illustrative purposes only, and is not meant to limit the scope of the present disclosure to any particular type of frequency response shown. In FIG. 5, the horizontal axis plots frequency, while the vertical axis plots the magnitude of the ratio between V2 and V1. As earlier described hereinabove, V1 corresponds to the single-ended output of the LNA 152 provided to the single-ended portion 153a of the transformer 153, while V2 corresponds to the differential voltage at the differential portion 153b of transformer 153. As illustrated in FIG. 5, a notch is designed to be present in the frequency response of V2/V1 at a jammer frequency.

One of ordinary skill in the art will appreciate that various techniques are known in the art for implementing a notch filter as described above. For example, implementing the notch filter 410 using passive elements L 411 and C 412 advantageously avoids the need to design and test active notch filtering circuits for this purpose. It will nevertheless be appreciated that active circuits may also be adopted for implementing the notch filter 410 using techniques known in the art, and such alternative exemplary embodiments are contemplated to be within the scope of the present disclosure.

Figure 4A:
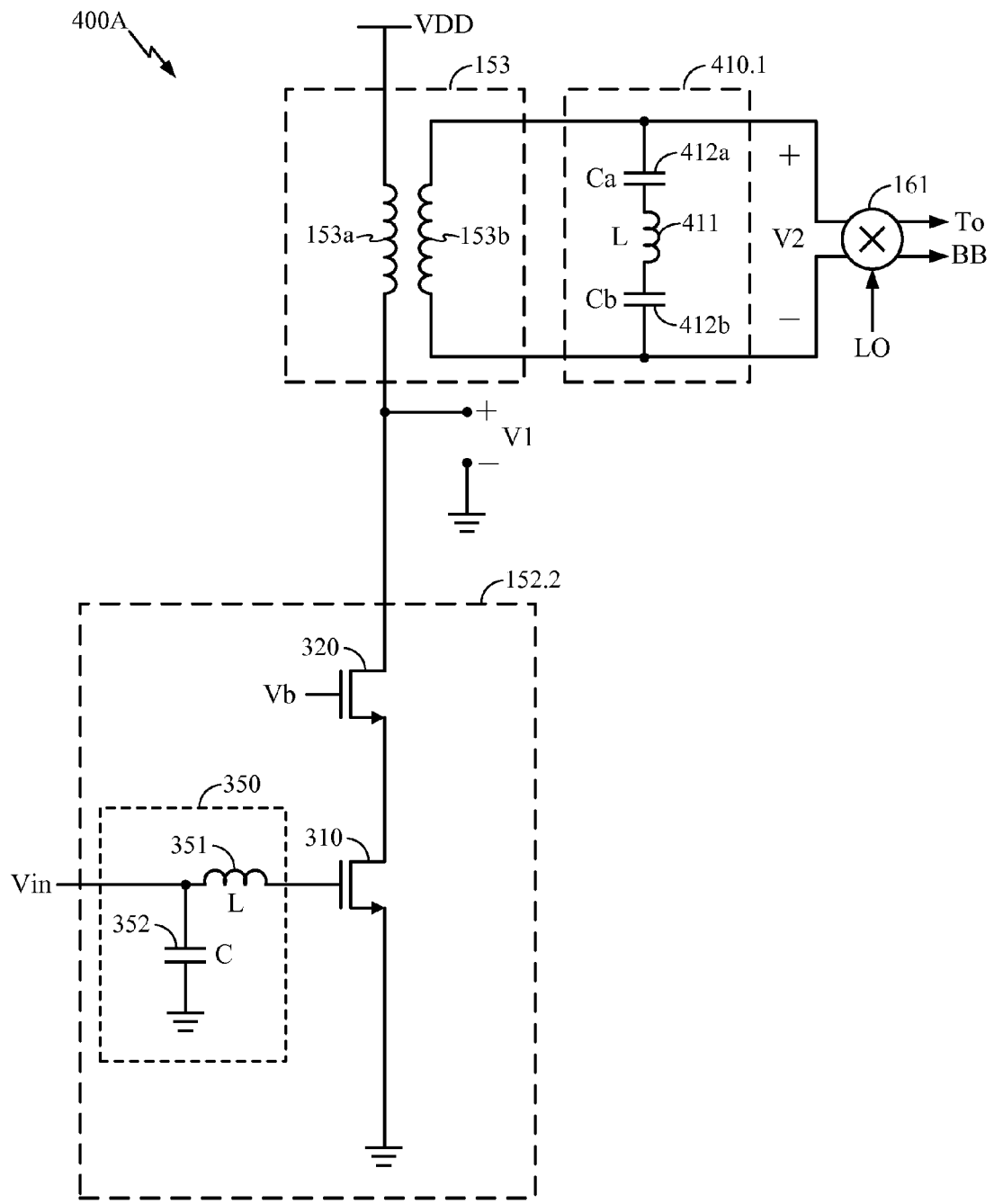

FIG. 4A illustrates an exemplary embodiment 400A, wherein the notch filter 410.1 is implemented as a series C-L-C circuit. In particular, the notch filter 410.1 includes an inductor L 411 coupled in series with a capacitance C 412, which is split into a first portion Ca 412a and a second portion Cb 412b. In an exemplary embodiment, the values of L 411 and C 412 are appropriately chosen to have a resonant frequency corresponding to an OOB jammer frequency, thus providing effective rejection of the OOB jammer prior to the mixer 161.

It will be appreciated that providing an L-C notch design as shown in FIG. 4A may be particularly effective when the OOB jammer frequency is far from the in-band tone (e.g., when the OOB jammer includes odd LO harmonics such as 3LO, 5LO, etc.), since significant in-band drooping in the frequency response may be avoided with sufficiently high Q (quality factor) of the L-C circuit.

Figure 9A:
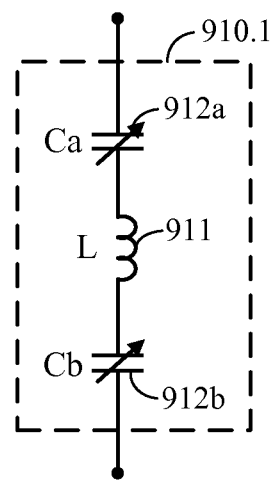
FIGS. 9A and 9B illustrate exemplary embodiments of tunable notch filters according to the present disclosure.

In an exemplary embodiment, the capacitance of either or both portions 412a, 412b of the capacitor of L-C notch filter 410.1 can be made programmable to provide dynamic tuning of the resonant frequency. For example, any of the capacitances may be implemented using a parallel bank of switchable capacitors, wherein the total capacitance enabled selected will effectively set the resonant frequency of the L-C notch filter 410.1. Such a feature may be advantageous to tune the notch frequency, e.g., to compensate for variations in the notch frequency due to integrated-circuit process variability. FIG. 9A illustrates an exemplary embodiment of such a tunable notch filter 910.1, which may replace the L-C notch filter 410.1 shown in FIG. 4A in certain exemplary embodiments. Note the capacitors 912a, 912b in the filter 910.1 may have variable capacitance, which may implemented using techniques known in the art, e.g., banks of parallel switchable capacitors, varactor elements, etc. In certain implementations, only one of the capacitors 912a, 912b may be implemented with variable capacitance, while the other capacitor has a fixed capacitance. Such exemplary embodiments are contemplated to be within the scope of the present disclosure.

In an exemplary embodiment, the inductor 411 may be placed in series between split portions 412a and 412b of the capacitance, as shown, thereby achieving a "balanced" configuration for the notch filter. In alternative exemplary embodiments (not shown), the capacitance 412 need not be split into two portions, and may instead be provided as a single lumped capacitance in series with the inductor 411. In further alternative exemplary embodiments (not shown), an L-C filter having an arbitrary design may be provided between the nodes of the differential portion 153b of the transformer, wherein the L and the C values of such an L-C filter may be appropriately chosen to attenuate jammer frequencies. Such alternative exemplary embodiments are contemplated to be within the scope of the present disclosure.

Figure 4B:
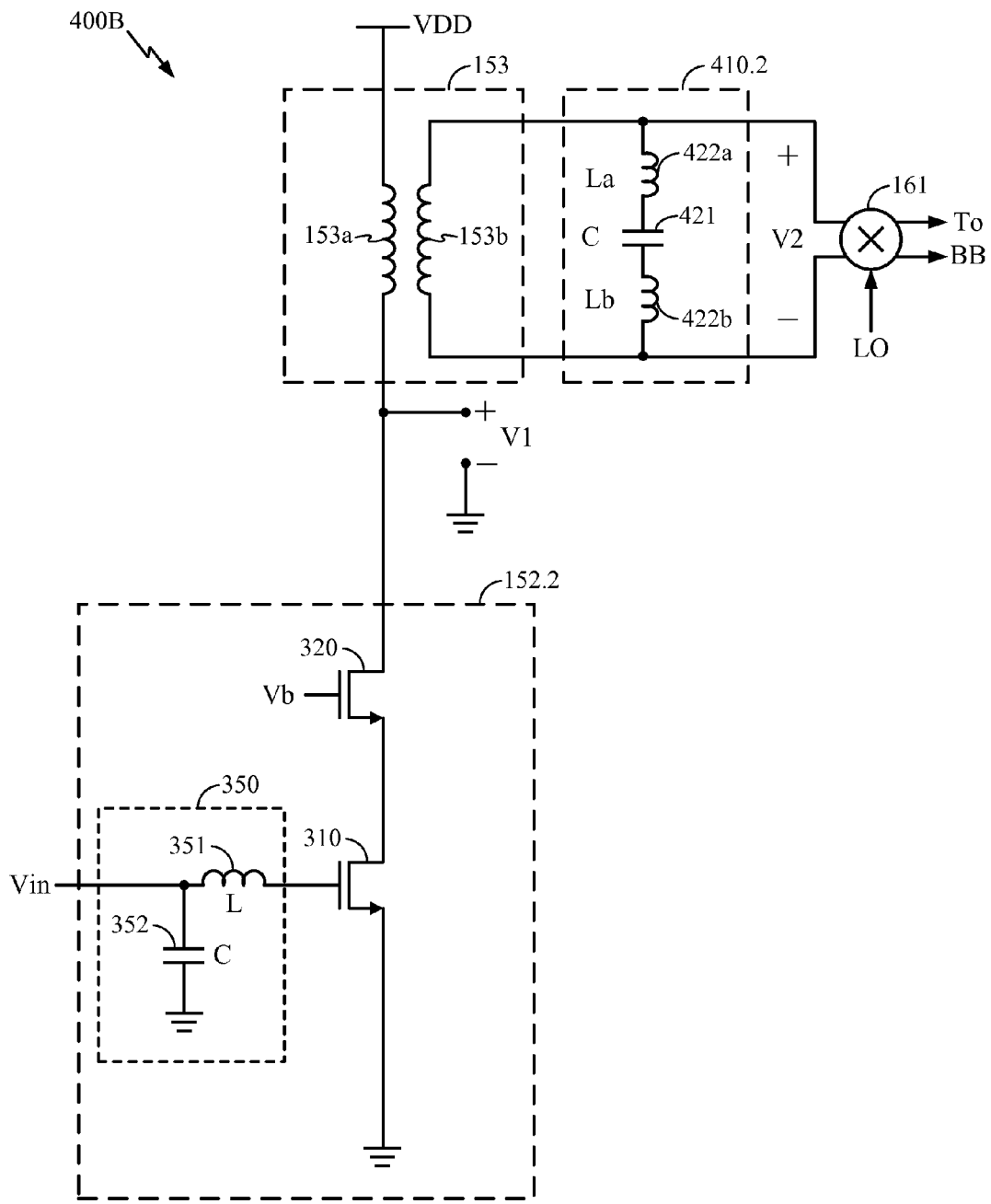

FIG. 4B illustrates an alternative exemplary embodiment 400B, wherein the notch filter 410.2 is implemented as a series L-C-L circuit. In particular, the notch filter 410.2 includes a capacitor C 421 coupled in series with an inductance L 422, which is split into a first portion La 422a and a second portion Lb 422b. In an exemplary embodiment, the values of C 421 and L 422 are appropriately chosen to have a resonant frequency corresponding to an OOB jammer frequency, thus providing effective rejection of the OOB jammer prior to the mixer 161.

Figure 9B:
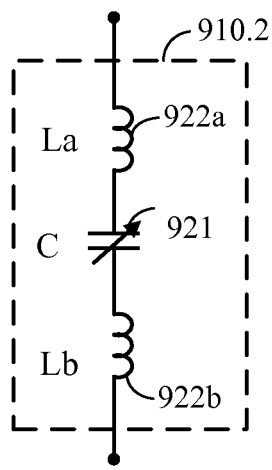

FIG. 9B illustrates an exemplary embodiment of a tunable notch filter 910.2 incorporating L-C-L circuitry, which may replace the L-C notch filter 410.2 shown in FIG. 4B in certain exemplary embodiments. Note the capacitor 921 in the filter 910.2 may have variable capacitance, which may be implemented using techniques known in the art, e.g., banks of parallel switchable capacitors, varactor elements, etc. Such exemplary embodiments are contemplated to be within the scope of the present disclosure.

Note while the notch filters 410.1 and 410.2 shown in FIGS. 4A and 4B are shown with specific L-C configurations, it will be appreciated that any type of notch filter known in the art may alternatively be utilized within the scope of the present disclosure. For example, alternative combinations of capacitors and inductors, as well as additional elements such as resistors and/or other passive and active elements, may be utilized. In general, various techniques are known in the art of circuit design for designing a notch filter such as may be utilized to provide a notch filter between the transformer and mixer such as described hereinabove. For example, the notch filter may be implemented using techniques known in the art for designing an elliptical filter, or a Type II Chebyshev filter. Such alternative exemplary embodiments are contemplated to be within the scope of the present disclosure.

Figure 6:
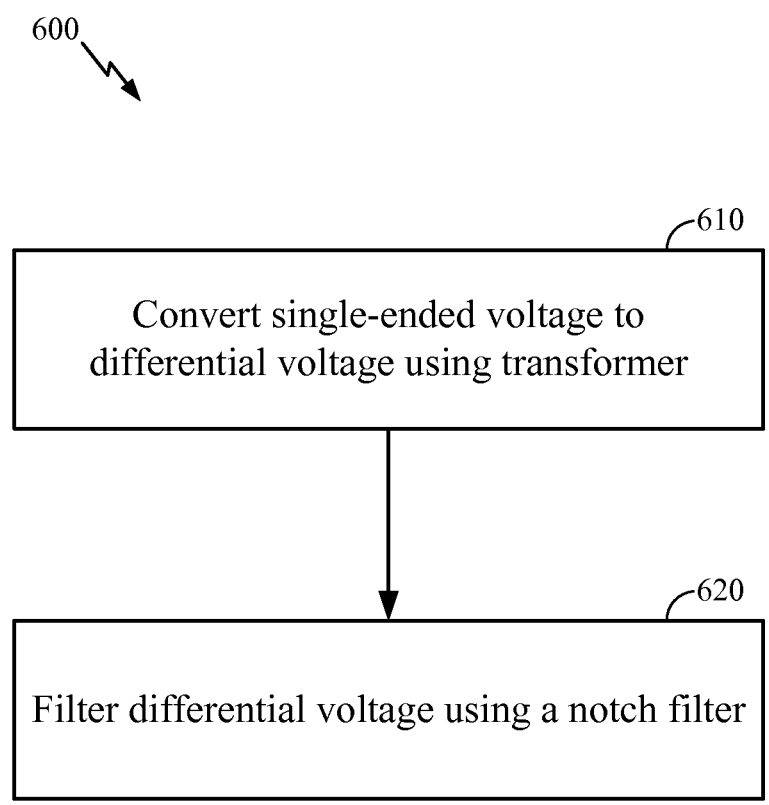
FIG. 6 illustrates an exemplary embodiment of a method according to the present disclosure.

FIG. 6 illustrates an exemplary embodiment of a method 600 according to the present disclosure. Note the method 600 is shown for illustrative purposes only, and is not meant to limit the scope of the present disclosure to any particular method shown.

In FIG. 6, at block 610, a single-ended voltage is converted to a differential voltage using a transformer.

At block 620, the differential voltage is filtered using a notch filter. In an exemplary embodiment, the notch frequency of the notch filter may be chosen to correspond to a jammer frequency of a wireless radio incorporating the transformer and the notch filter.

Figure 7:
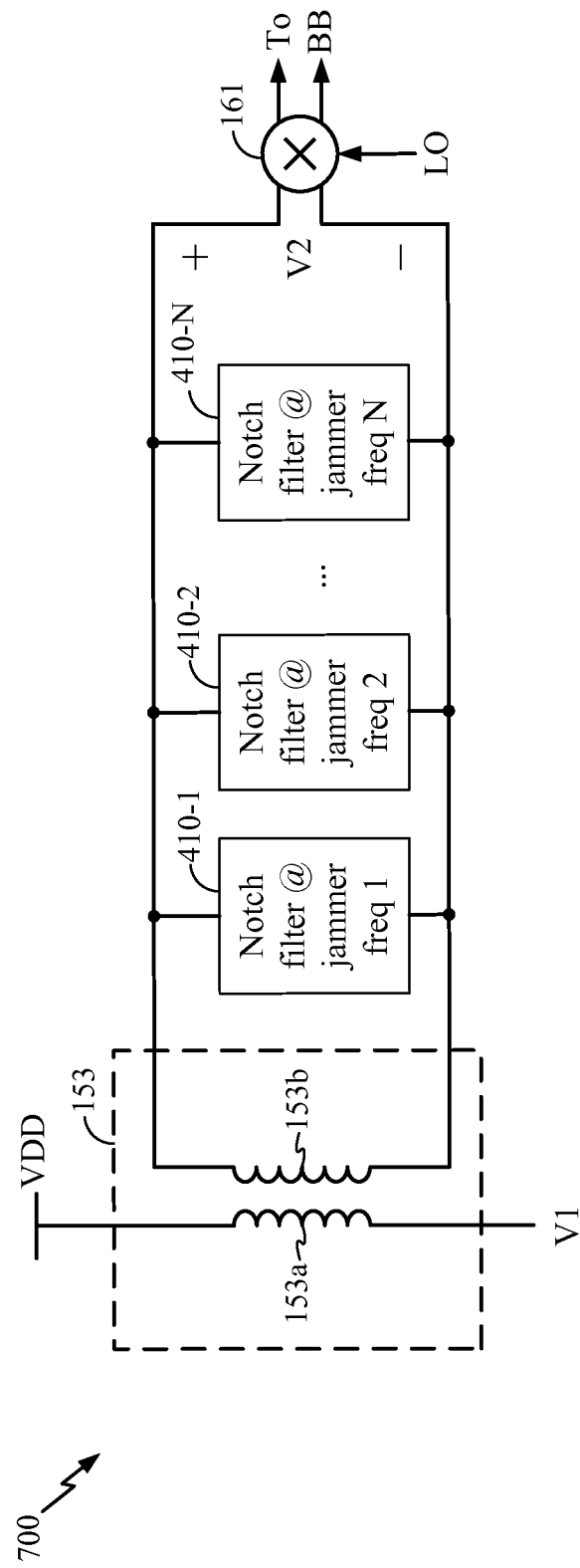
FIGS. 7 and 8 illustrate an alternative exemplary embodiment of the present disclosure, wherein multiple notch filters are provided in parallel to provide rejection at multiple jammer frequencies.
Figure 8:
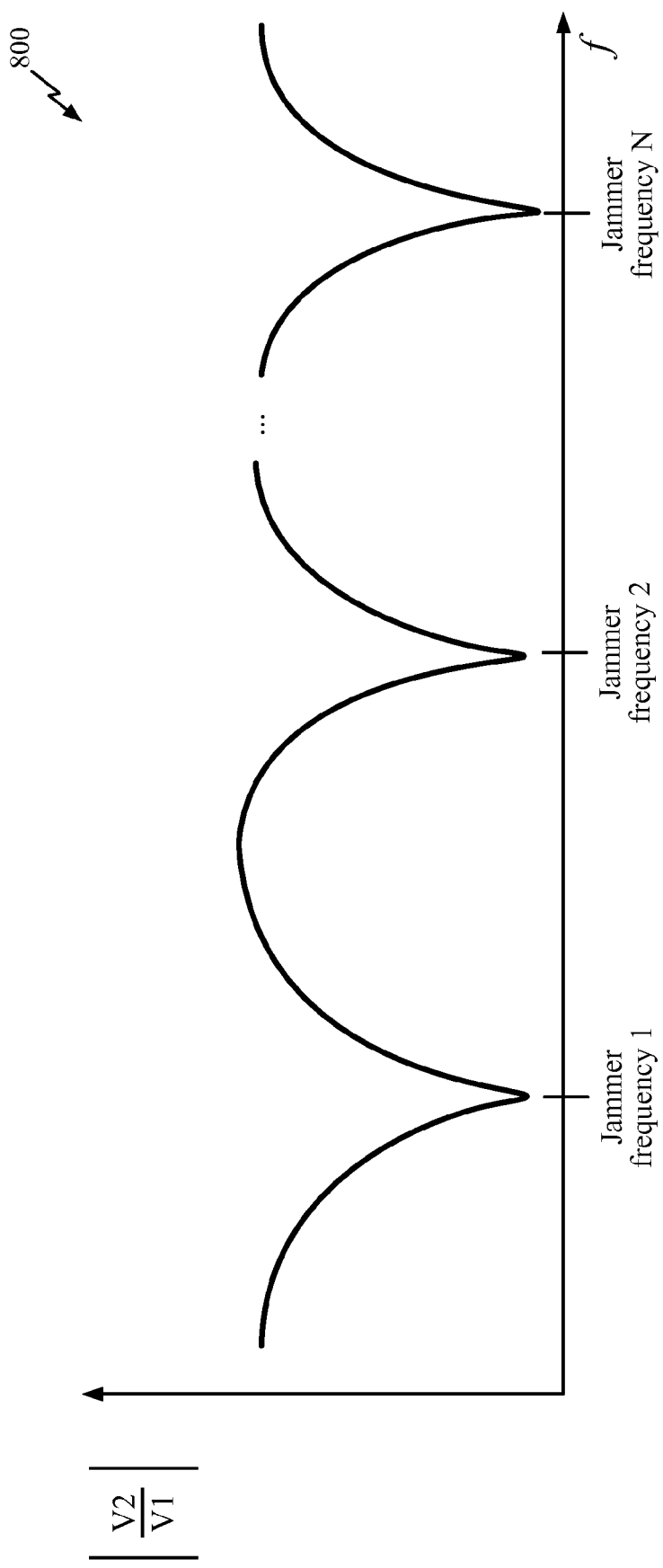

FIGS. 7 and 8 illustrate an alternative exemplary embodiment of the present disclosure, wherein multiple notch filters are provided in parallel to provide rejection at multiple jammer frequencies. In FIG. 7, a portion 700 of the receive chain shows the differential portion 153b of the transformer 153 coupled to a plurality of notch filters 410-1 through 410-N. In particular, a first notch filter 410-1 having a notch frequency coinciding with a first jammer frequency (or jammer freq 1) is coupled in parallel with a second notch filter 410-2 having a notch frequency coinciding with a second jammer frequency (or jammer freq 2), etc., up to an N-th notch filter 410-N having a notch frequency coinciding with an N-th jammer frequency (or jammer freq N). The effect of placing such a plurality of notch filters in parallel is shown in FIG. 8, wherein the frequency response 800 of the transfer function from V1 to V2 is seen to have multiple notches in frequency, corresponding to the multiple jammer frequencies expected.

It will be appreciated that in the exemplary embodiment 700, each of the notch filters 410-1 through 410-N may be implemented according to the techniques of the present disclosure. For example, any of the notch filters may incorporate a series C-L-C circuit as described with reference to FIG. 4A hereinabove, or a series L-C-L circuit as described with reference to FIG. 4B. Furthermore, any of the notch filters may be implemented independently of the other notch filters, e.g., notch filter 410-1 may incorporate a series C-L-C circuit, while notch filter 410-2 may incorporate a series L-C-L circuit, etc. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    a transformer comprising a single-ended portion and a differential portion, the differential portion defining a differential voltage between a first node and a second node; and
    a plurality of notch filters coupled in parallel with each other, each notch filter coupled between the first node and the second node, each notch filter comprising an inductor coupled in series with at least one capacitor, each notch filter having a different notch frequency than all other notch filters of the plurality of notch filters.

2. The apparatus of claim 1, at least one of the notch filters comprising a first capacitor, a second capacitor, and an inductor coupled in series between the first and second capacitors.

3. The apparatus of claim 1, the at least one capacitor having an adjustable capacitance.

4. The apparatus of claim 3, wherein the at least one capacitor having adjustable capacitance comprises a parallel bank of selectively switchable capacitors.

5. The apparatus of claim 1, the notch filter comprising an elliptic filter or a Chebyshev Type II filter.

6. The apparatus of claim 1, further comprising a low-noise amplifier having an output coupled to the single-ended portion of the transformer, and a mixer having a differential input coupled to the differential portion of the transformer.

7. The apparatus of claim 6, the single-ended portion of the transformer comprising a first terminal coupled to a DC source voltage, and a second terminal coupled to the output of the low-noise amplifier.

8. The apparatus of claim 7, wherein the low-noise amplifier comprises an input transistor coupled to a cascode transistor.

9. An apparatus comprising:
    means for converting a single-ended voltage to a differential voltage using a transformer, the differential voltage defined between a first node and a second node; and
    means for filtering the differential voltage using a plurality of notch filters coupled in parallel with each other, each notch filter coupled between the first node and the second node, each notch filter comprising an inductor coupled in series with at least one capacitor, each notch filter having a different notch frequency than all other notch filters of the plurality of notch filters.

10. The apparatus of claim 9, the means for filtering comprising an L-C filter, the apparatus further comprising:
    means for adjusting the notch frequency of at least one of the notch filters by setting the value of an adjustable capacitance of the L-C filter.

11. The apparatus of claim 10, at least one of the notch filters comprising a first capacitor coupled in series with an inductor coupled in series with a second capacitor.

12. The apparatus of claim 10, at least one of the notch filters comprising a first inductor coupled in series with a capacitor coupled in series with a second inductor.

13. The apparatus of claim 10, at least one of the notch filters comprising an elliptic filter or a Chebyshev Type II filter.

14. A method comprising:
    converting a single-ended voltage to a differential voltage using a transformer, the differential voltage defined between a first node and a second node; and
    filtering the differential voltage using a plurality of notch filters coupled in parallel with each other, each notch filter coupled between the first node and the second node, each notch filter comprising an inductor coupled in series with at least one capacitor, each notch filter having a different notch frequency than all other notch filters of the plurality of notch filters.

15. The method of claim 14, at least one of the notch filters comprising an adjustable capacitance, the method further comprising:
    adjusting the notch frequency of at least one of the notch filters by setting the value of the adjustable capacitance.

16. The method of claim 14, the filtering comprising coupling the terminals of the differential voltage to at least one notch filter comprising a first capacitor coupled in series with an inductor coupled in series with a second capacitor.

17. The method of claim 14, the filtering comprising coupling the terminals of the differential voltage to at least one notch filter comprising a first inductor coupled in series with a capacitor coupled in series with a second inductor.

18. The method of claim 14, the filtering comprising filtering with an elliptic filter or a Chebyshev Type II filter.

* * * * *